(12) United States Patent
Dewey et al.

(10) Patent No.: US 11,721,735 B2
(45) Date of Patent: *Aug. 8, 2023

(54) THIN FILM TRANSISTORS HAVING U-SHAPED FEATURES

(71) Applicant: Intel Corporation, Santa Clara, CA (US)

(72) Inventors: Gilbert Dewey, Beaverton, OR (US); Aaron Lilak, Beaverton, OR (US); Van H. Le, Portland, OR (US); Abhishek A. Sharma, Portland, OR (US); Tahir Ghani, Portland, OR (US); Willy Rachmady, Beaverton, OR (US); Rishabh Mehandru, Portland, OR (US); Nazila Haratipour, Portland, OR (US); Jack T. Kavalieros, Portland, OR (US); Benjamin Chu-Kung, Boise, ID (US); Seung Hoon Sung, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/580,550

(22) Filed: Jan. 20, 2022

(65) Prior Publication Data

US 2022/0149209 A1 May 12, 2022

Related U.S. Application Data

(63) Continuation of application No. 16/024,682, filed on Jun. 29, 2018, now Pat. No. 11,264,512.

(51) Int. Cl.
*H01L 29/423* (2006.01)
*H01L 29/786* (2006.01)
(Continued)

(52) U.S. Cl.
CPC .. *H01L 29/4236* (2013.01); *H01L 21/823412* (2013.01); *H01L 21/823437* (2013.01);
(Continued)

(58) Field of Classification Search
CPC ..... H01L 21/823412; H01L 21/823418; H01L 21/823437; H01L 21/823487;
(Continued)

(56) References Cited

U.S. PATENT DOCUMENTS

2011/0284968 A1* 11/2011 Lee .................. H01L 29/66628
257/410
2013/0092930 A1* 4/2013 Kimura .............. H01L 27/1255
257/300

(Continued)

*Primary Examiner* — Cheung Lee
(74) *Attorney, Agent, or Firm* — Schwabe, Williamson & Wyatt, P.C.

(57) ABSTRACT

Thin film transistors having U-shaped features are described. In an example, integrated circuit structure including a gate electrode above a substrate, the gate electrode having a trench therein. A channel material layer is over the gate electrode and in the trench, the channel material layer conformal with the trench. A first source or drain contact is coupled to the channel material layer at a first end of the channel material layer outside of the trench. A second source or drain contact is coupled to the channel material layer at a second end of the channel material layer outside of the trench.

20 Claims, 13 Drawing Sheets

(51) Int. Cl.
*H01L 29/66* (2006.01)
*H01L 21/8234* (2006.01)

(52) U.S. Cl.
CPC .. *H01L 29/42384* (2013.01); *H01L 29/66757* (2013.01); *H01L 29/66969* (2013.01); *H01L 29/7869* (2013.01); *H01L 29/78603* (2013.01); *H01L 29/78618* (2013.01); *H01L 29/78642* (2013.01); *H01L 29/78696* (2013.01); *H01L 29/66545* (2013.01)

(58) Field of Classification Search
CPC ......... H01L 29/41733; H01L 29/41741; H01L 29/42356; H01L 29/4236; H01L 29/42384; H01L 29/66545; H01L 29/66757; H01L 29/66969; H01L 29/78603; H01L 29/78618; H01L 29/78642; H01L 29/7869; H01L 29/78696; B82Y 40/00
See application file for complete search history.

(56) References Cited

U.S. PATENT DOCUMENTS

| | | | |
|---|---|---|---|
| 2016/0049494 A1 | 2/2016 | Zschatzsch et al. | |
| 2017/0077301 A1* | 3/2017 | Pawlak | H01L 29/785 |

\* cited by examiner

THIN FILM TRANSISTORS HAVING U-SHAPED FEATURES

CROSS-REFERENCE TO RELATED APPLICATIONS

This application is a continuation of U.S. patent application Ser. No. 16/024,682, filed on Jun. 29, 2018, the entire contents of which is hereby incorporated by reference herein.

TECHNICAL FIELD

Embodiments of the disclosure are in the field of integrated circuit structures and, in particular, thin film transistors having U-shaped features.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

The performance of a thin-film transistor (TFT) may depend on a number of factors. For example, the efficiency at which a TFT is able to operate may depend on the sub threshold swing of the TFT, characterizing the amount of change in the gate-source voltage needed to achieve a given change in the drain current. A smaller sub threshold swing enables the TFT to turn off to a lower leakage value when the gate-source voltage drops below the threshold voltage of the TFT. The conventional theoretical lower limit at room temperature for the sub threshold swing of the TFT is 60 millivolts per decade of change in the drain current.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
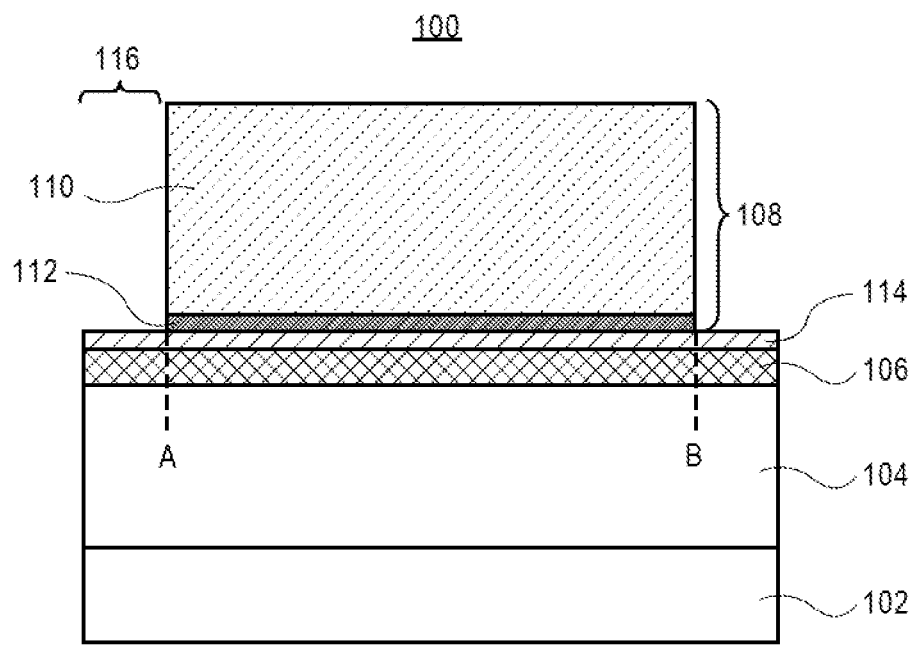
FIG. 1A illustrates a cross-sectional view taken along a gate "width" of a conventional thin film integrated circuit structure.

Thin film transistors having U-shaped features are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating BEOL thin film transistors (TFTs) having relatively increased channel length or relatively increased channel width relative to TFTs of conventional geometry. Embodiments may include or pertain to one or more of back end transistors, semiconducting oxide materials, thin film transistors, and system-on-chip (SoC) technologies. One or more embodiments may be implemented to realize high performance backend transistors to potentially increase monolithic integration of back-end logic plus memory in SoCs of future technology nodes.

To provide context, there is increased need for advanced SoCs to include monolithically integrated BEOL transistors for logic functionality at higher metal layers. Such BEOL transistors typically have a lower thermal budget than front end transistors due to increased thermal sensitivity of back-end materials. Also, the performance of such transistors may be severely hampered due to low channel mobility for BEOL-compatible channel materials.

In accordance with one or more embodiments described herein, non-planar BEOL-compatible thin film transistors (TFTs) are fabricated by effectively increasing the transistor channel length or channel width for a given projected area. A TFT fabricated using such an architecture may exhibit an increase in gate control, stability, and performance of thin film transistors. Applications of such systems may include, but are not limited to, back end (BEOL) logic, memory, or analog applications. Embodiments described herein may include non-planar structures that effectively increase transistor length or width (relative to a planar device) by integrating the devices in unique architectures.

In a first aspect, non-planar geometries, such as U-shaped trenches or other features, are used to increase transistor channel width. To provide a benchmark, FIG. 1A illustrates a cross-sectional view taken along a gate "width" of a conventional thin film integrated circuit structure.

Referring to FIG. 1A, a planar TFT 100 is formed above a substrate 102, e.g., on an insulating layer 104 above a substrate, as is shown. The planar TFT 100 includes a channel material 106, such as a semiconducting oxide material. A gate electrode 108 is formed on a gate dielectric layer 114 formed on the channel material 106. The gate electrode 108 may include a fill material 110 on a workfunction layer 112, as is depicted. The gate electrode 108 may expose regions 116 of the channel material 106 and the gate dielectric layer 114, as is depicted. Alternatively, the channel material 106 and the gate dielectric layer 114 have a same lateral dimension as the gate electrode 108. It is to be appreciated that source/drain regions are into and out of the page of the view of FIG. 1A.

The planar TFT 100 has an effective gate width that is the length of the planar channel material 106 between locations A and B, as depicted in FIG. 1A. The TFT 100 may be may be a planar BEOL field effect transistor (FET).

Figure 1B:
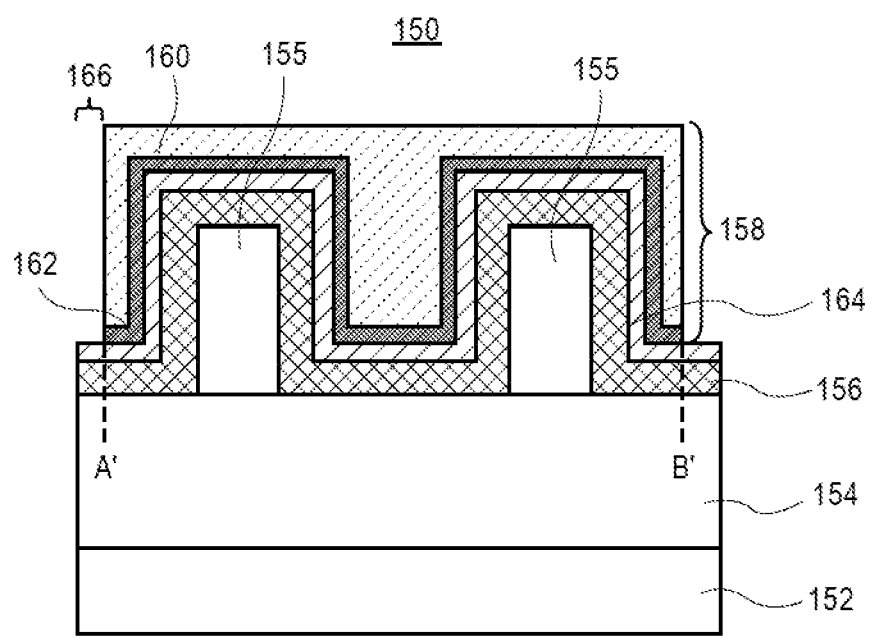
FIG. 1B illustrates a cross-sectional view taken along a gate "width" of a thin film integrated circuit structure having relatively increased width, in accordance with an embodiment of the present disclosure.

As a first example of a structure having relative increase in transistor width (e.g., relative to the structure of FIG. 1A), FIG. 1B illustrates a cross-sectional view taken along a gate "width" of a thin film integrated circuit structure having relatively increased width, in accordance with an embodiment of the present disclosure.

Referring to FIG. 1B, a non-planar TFT 150 is formed above a substrate 152, e.g., on an insulating layer 154 above a substrate, as is shown. A pair of dielectric fins 155 is on the insulating layer 154. The non-planar TFT 150 includes a channel material 156, such as a semiconducting oxide material. The channel material 156 is conformal with the pair of dielectric fins 155 and with exposed portions of the insulating layer 154 between the pair of dielectric fins 155. A gate electrode 158 is formed on a gate dielectric layer 164 formed on the channel material 156. The gate electrode 158 may include a fill material 160 on a workfunction layer 162, as is depicted. The gate electrode 158 may expose regions 166 of the channel material 156 and the gate dielectric layer 164, as is depicted. Alternatively, the channel material 156 and the gate dielectric layer 164 have a same lateral dimension as the gate electrode 158. It is to be appreciated that source/drain regions are into and out of the page of the view of FIG. 1B.

The non-planar TFT 150 has an effective gate width that is the length of the conformal channel material 156 between locations A' and B', i.e., the full length including undulating portions over the tops and sidewalls of the dielectric fins 155, as is depicted in FIG. 1B. The TFT 150 may be a non-planar BEOL field effect transistor (FET). In comparison to FIG. 1A, the structure of FIG. 1B highlights the advantage of a non-planar architecture to increase effective gate width, referred to herein as a relatively increased width.

Figure 1C:
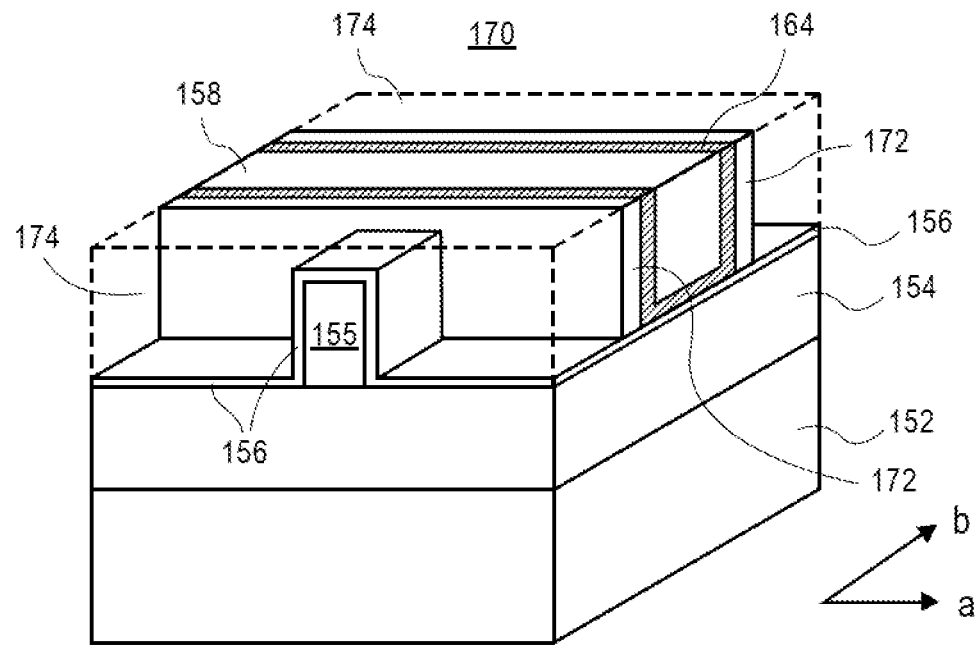
FIGS. 1C, 1D, and 1E illustrate angled and direct cross-sectional views of a thin film integrated circuit structure having relatively increased width, in accordance with an embodiment of the present disclosure.
Figure 1D:
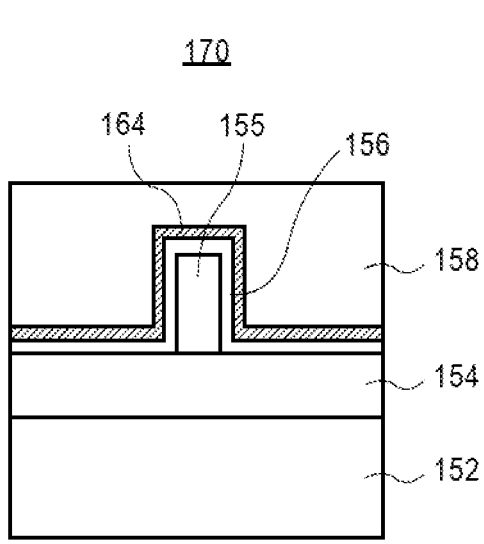
Figure 1E:
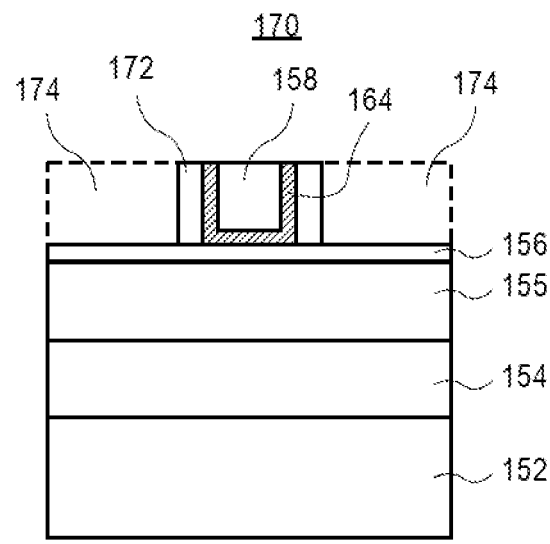

To highlight other aspects of a non-planar TFT topography, FIGS. 1C, 1D (a access, through gate electrode), and 1E (b access, through fin) illustrate angled and direct cross-sectional views of a thin film integrated circuit structure having relatively increased width, in accordance with an embodiment of the present disclosure. It is to be appreciated that one dielectric fin is illustrated in FIGS. 1C-1E for simplification. Embodiments may include a single device fabricated over one (FIG. 1C), two (FIG. 1B) or more such dielectric fins.

Referring to FIGS. 1C-1E, an integrated circuit structure 170 includes a dielectric fin 155 on an insulator layer 154 above a substrate 152. The dielectric fin 155 has a top and sidewalls. A channel material 156, such as a semiconducting oxide material, is on the top and sidewalls of the dielectric fin 155. A gate electrode 158 is over a first portion of the channel material 156 on the top and sidewalls of the dielectric fin 155. The gate electrode 158 has a first side opposite a second side. A first conductive contact (left 174) is adjacent the first side of the gate electrode 158, over a second portion of the channel material 156 on the top and sidewalls of the dielectric fin 155. A second conductive contact (right 174) is adjacent the second side of the gate electrode 158, over a third portion of the channel material 156 on the top and sidewalls of the dielectric fin 155.

In an embodiment, the integrated circuit structure 170 further includes a gate dielectric layer 164, such as a high-k dielectric layer, between the gate electrode 158 and the first portion of the channel material 156 on the top and sidewalls of the dielectric fin 155, as is depicted in FIGS. 1C-1E. In an embodiment, the integrated circuit structure 170 further includes a first dielectric spacer (left 172) between the first conductive contact 174 and the first side of the gate electrode 158, the first dielectric spacer 172 over a fourth portion of the channel material 156 on the top and sidewalls of the dielectric fin 155. A second dielectric spacer (right 172) is between the second conductive contact 174 and the second side of the gate electrode 158, the second dielectric spacer 172 over a fifth portion of the channel material 156 on the top and sidewalls of the dielectric fin 155, as is depicted in FIGS. 1C and 1E. In one such embodiment, the gate dielectric layer 164 is further along the first and second dielectric spacers 172, as is also depicted in FIGS. 1C and 1E.

In an embodiment, the insulator structure 155 (such as fin or fins 155) is composed of a dielectric material such as, but not limited to, silicon dioxide, silicon oxy-nitride, silicon nitride, or carbon-doped silicon nitride. In an embodiment, the insulator structure 155 is composed of a low-k dielectric material. In an embodiment, dielectric fins described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have dielectric fins spaced at a constant pitch and having a constant width. The pattern may be fabricated by a pitch halving or pitch quartering, or other pitch division, approach. In an embodiment, the dielectric fin or fins 155 each have squared-off (as shown) or rounder corners.

In accordance with an embodiment of the present disclosure, the above TFT non-planar architectures 150 and 170 provide for higher effective widths for a transistor for a scaled projected area. In an embodiment, the drive strength and performance of such transistors are improved over state-of-the-art planar BEOL transistors.

In a second aspect, non-planar geometries, such as U-shaped trenches, are used to increase transistor channel length. In an embodiment, ultra-long channel thin film transistors with top or bottom gates are described. In one embodiment, very long channel thin film transistors are implemented into an integrated circuit with high area/footprint efficiency. Such long-channel structures may be useful for low-leakage/low power applications.

In particular embodiments, a three-dimensional topography is formed on a wafer surface upon which a thin film semiconductor is deposited in a conformal manner. The resulting three-dimensional thin film semiconductor is gated from either the top or bottom side to provide a channel length which is approximately equal to the traced distance along the surface (e.g., which can be significantly greater than the projected distance between two points on surface). In one embodiment, very long channel TFT devices are described that do not have an area penalty that would typically be associated with such devices.

TFT devices described herein may be integrated anywhere within a semiconductor die (e.g., above an existing layer of devices, adjacent to existing devices, etc.). For ease of illustration, some devices are described herein in an isolated environment without other features present. Such other features would be apparent to one skilled in the art.

Figure 2:
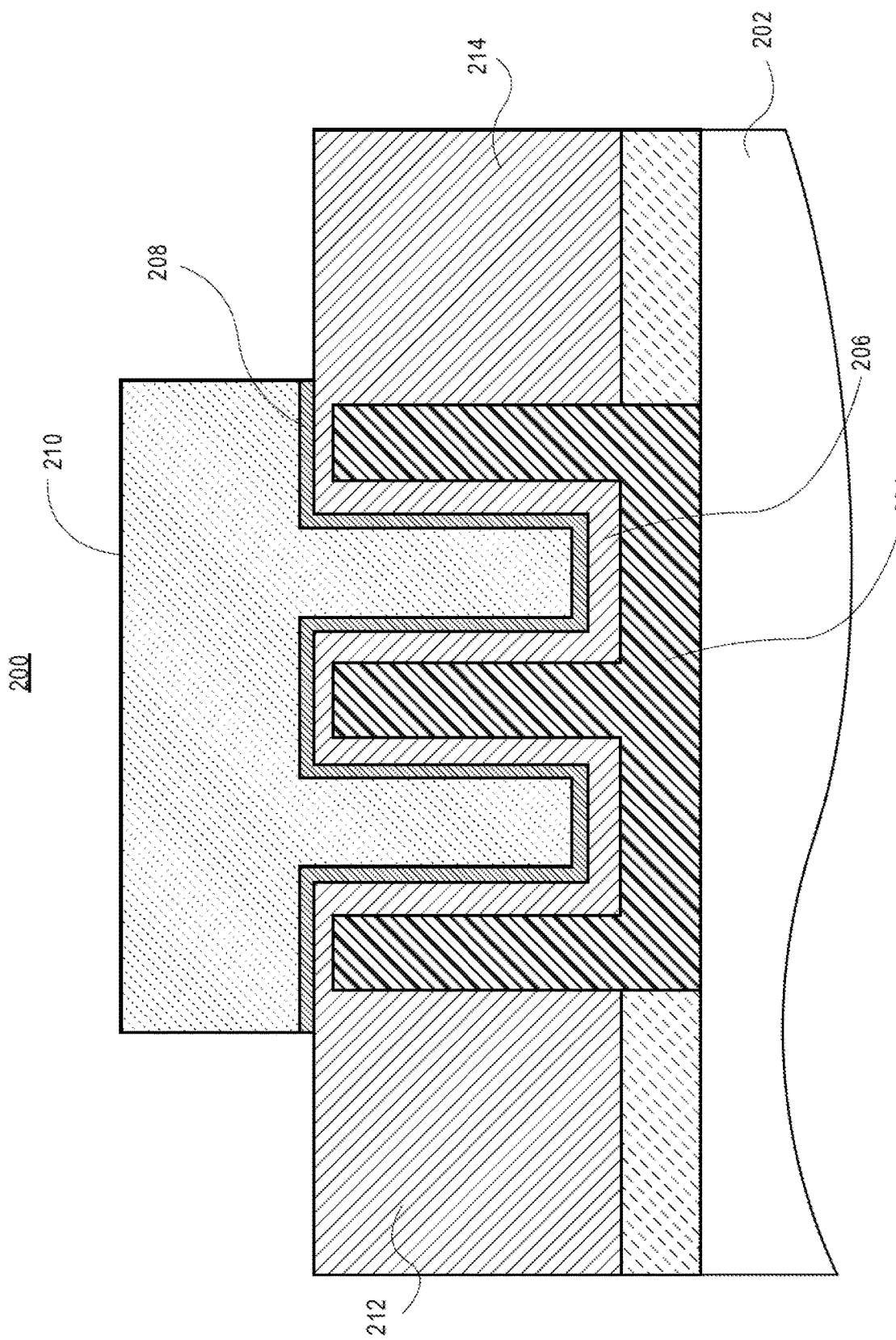
FIG. 2 illustrates a cross-sectional view of a thin film integrated circuit structure having U-shaped features, in accordance with an embodiment of the present disclosure.

In an example, FIG. 2 illustrates a cross-sectional view of a thin film integrated circuit structure having U-shaped features, in accordance with an embodiment of the present disclosure.

Referring to FIG. 2, an integrated circuit structure 200 includes an insulator structure 204 above a substrate 202. The insulator structure 204 has a plurality of trenches therein, which are referred to herein as U-shaped features. The insulator structure 204 has a first side opposite a second side. A channel material layer 206 is on the insulator structure 204. The channel material layer 206 is conformal with the plurality of trenches of the insulator structure 204. A gate electrode 210 is over the channel material layer 206 and in the plurality of trenches of the insulator structure 204. A first source or drain region 212 is coupled to the channel material layer 206 at the first side of the insulator structure 204. A second source or drain region 214 is coupled to the channel material layer 206 at the second side of the insulator structure 204.

In an embodiment, the first and second source or drain regions 212 and 214 are continuous with the channel material layer 206, as is depicted in FIG. 2. In an embodiment, the integrated circuit structure 200 further includes a gate dielectric layer 208 between the gate electrode 210 and the channel material layer 206. At least a portion of the gate dielectric layer 208 is in the plurality of trenches of the insulator structure 204, as is depicted in FIG. 2.

In an embodiment, the plurality of trenches of the insulator structure 204 may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have U-shaped trenches spaced at a constant pitch and having a constant width. The pattern may be fabricated by a pitch halving or pitch quartering, or other pitch division, approach.

In an aspect, back end U-gate thin film transistors are described. To provide context, most state of the art thin film transistors are single gate. This has a consequence that as area scales, gate length scales and it becomes more difficult to turn off the transistor channel. In an embodiment, using a U-gate device increases the gate length in the same footprint allowing a cell area to continue to scale, but with a dimension where a gate length can remain long and thus result in better channel control. In an exemplary embodiment, one or more U-shape features are etched into a bottom metal line on which a back end thin film transistor is formed and gated. The U-shape increases the gate length of the device in the same top down area to enable better gate control without resorting to aggressive gate oxide thinning or resorting to double and triple gates or gate-all-around devices.

Figure 3A:
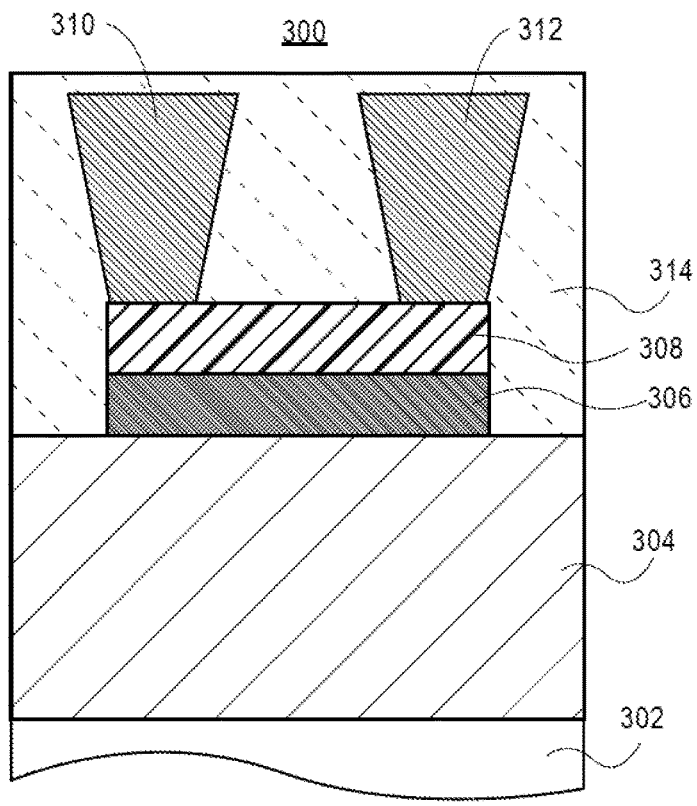
FIGS. 3A and 3B illustrate cross-sectional views of thin film integrated circuit structures without and with a U-shaped feature, in accordance with an embodiment of the present disclosure.
Figure 3B:
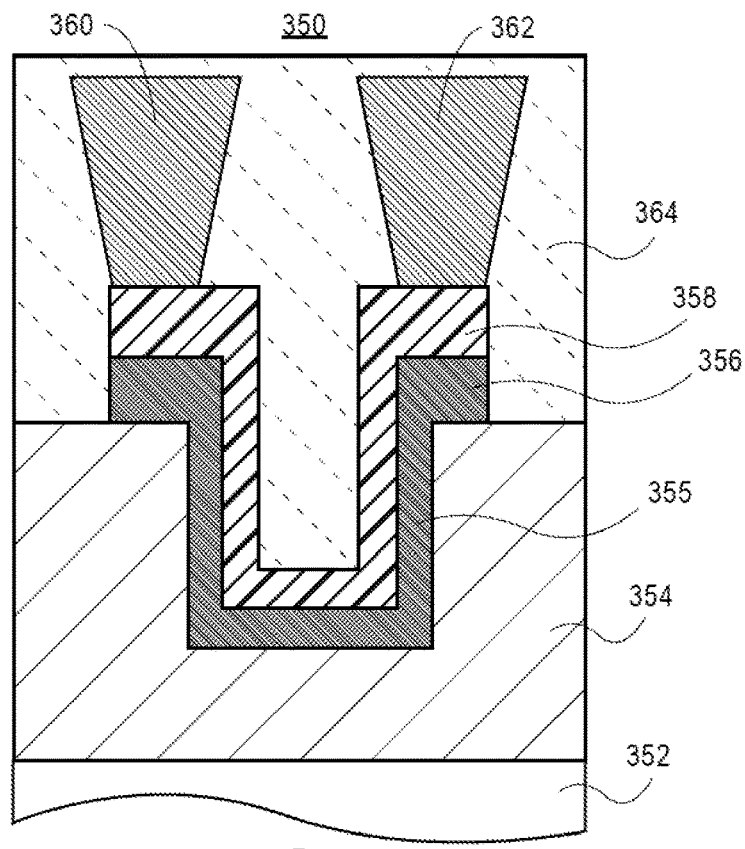

To provide an illustrative comparison for concepts described herein, FIGS. 3A and 3B illustrate cross-sectional views of thin film integrated circuit structures without and with a U-shaped feature, in accordance with an embodiment of the present disclosure.

Referring to FIG. 3A, an integrated circuit structure 300 includes a gate electrode 304 above a substrate 302. A channel material layer 308 is over the gate electrode 304. A first source or drain contact 310 is coupled to the channel material layer 308 at a first end of the channel material layer 308. A second source or drain contact 312 is coupled to the channel material layer 308 at a second end of the channel material layer 308. A dielectric layer 314 is on the channel material layer 308. A gate dielectric layer 306 is between the gate electrode 304 and the channel material layer 308.

By contrast to FIG. 3A, referring to FIG. 3B, an integrated circuit structure 350 includes a gate electrode 354 above a substrate 352. The gate electrode 354 has a trench therein, which is referred to herein as a U-shaped feature. A channel material layer 358 is over the gate electrode 354 and in the trench. The channel material layer 358 is conformal with the trench. A first source or drain contact 360 is coupled to the channel material layer 358 at a first end of the channel material layer 358 outside of the trench. A second source or drain contact 362 is coupled to the channel material layer 358 at a second end of the channel material layer 358 outside of the trench.

In an embodiment, the integrated circuit structure 350 further includes a dielectric layer 364 on the channel material layer 358 and in the trench, as is depicted in FIG. 3B. In an embodiment, the integrated circuit structure 350 further includes a gate dielectric layer 356 between the gate electrode 352 and the channel material layer 358. At least a portion 355 of the gate dielectric layer 356 is in the trench, as is depicted in FIG. 3B.

Figure 4:
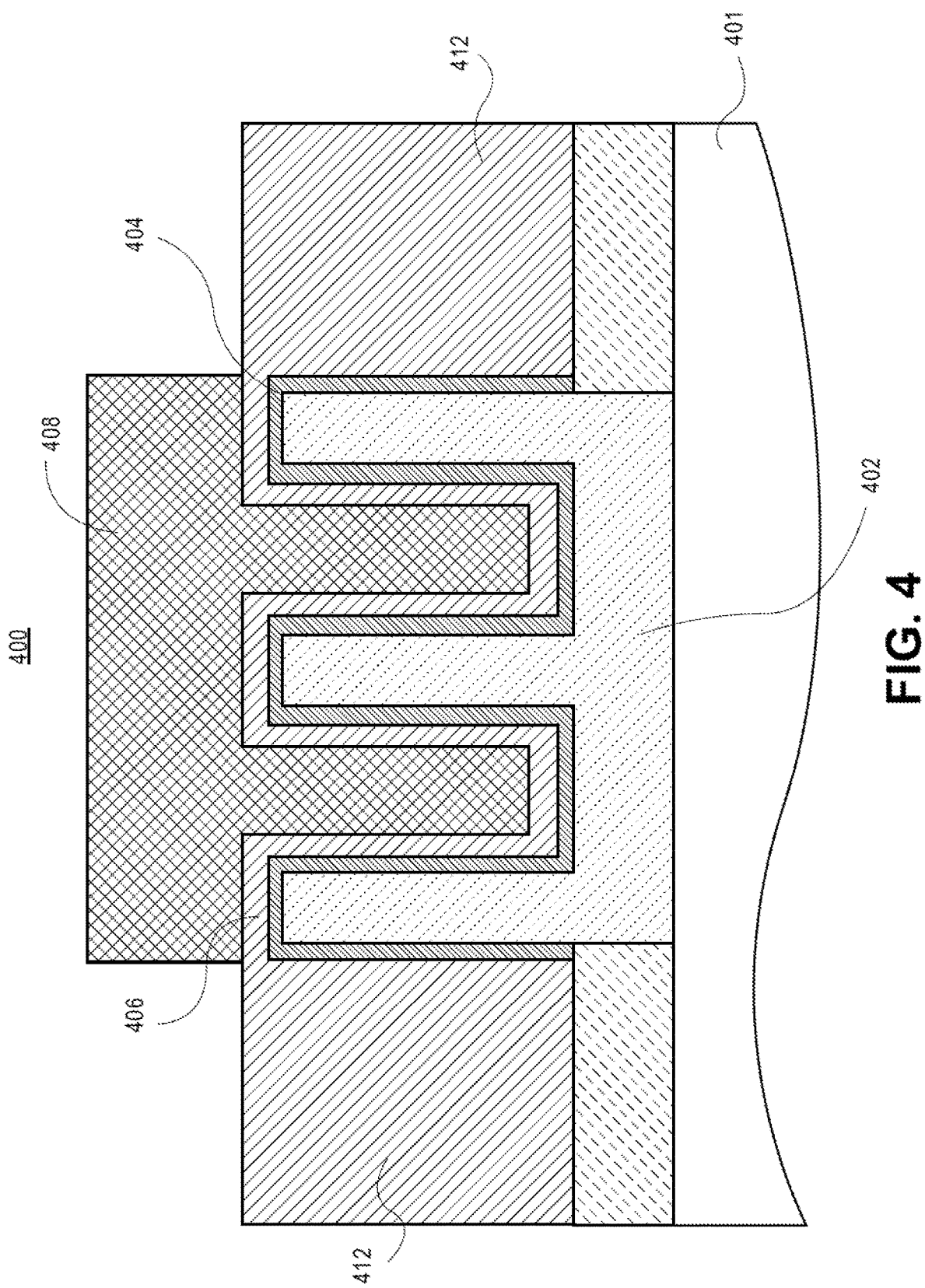
FIG. 4 illustrates a cross-sectional view of another thin film integrated circuit structure having U-shaped features, in accordance with another embodiment of the present disclosure.

In an example using more than one trench or U-shaped feature, FIG. 4 illustrates a cross-sectional view of another thin film integrated circuit structure having U-shaped features, in accordance with another embodiment of the present disclosure. It is to be appreciated that devices may be fabricated to have even greater than the two U-shaped features of FIG. 4.

Referring to FIG. 4, an integrated circuit structure 400 includes a gate electrode 402 above a substrate 401. The gate electrode 402 has a plurality of trenches therein, which are referred to herein as U-shaped features. The gate electrode 402 has a first side opposite a second side. A channel material layer 406 is over the gate electrode 402. The channel material layer 406 is conformal with the plurality of trenches of the gate electrode 402. An insulator structure 408 is on the channel material layer 406 and in the plurality of trenches of the gate electrode 402. A first source or drain region (e.g., left 412) is coupled to the channel material layer 406 at the first side of the gate electrode 402. A second source or drain region (e.g., right 412) is coupled to the channel material layer 406 at the second side of the gate electrode 402.

In an embodiment, the first and second source or drain regions 412 are continuous with the channel material layer 406, as is depicted in FIG. 4. In an embodiment, the integrated circuit structure 400 further includes a gate dielectric layer 404 between the gate electrode 402 and the channel material layer 406. At least a portion of the gate dielectric layer 404 is in the plurality of trenches of the gate electrode 402, as is depicted in FIG. 4.

Referring again to FIG. 4, in an embodiment, the channel length of integrated circuit structure 400 is provided by the approximate formula L=2*(feature pitch)+4*(height)+width. A planar TFT fabricated in a same space has a length of: L=2*(feature pitch)+width. More generally, it is to be appreciated that embodiment described herein contemplate the use of surfaces with maximal surface area. For example, in addition to the geometry depicted in FIG. 4, in an embodiment, a top surface upon which a thin film semiconductor layer is deposited may be sinusoidal, trapezoidal, ellipsoidal or another non-planar topographical shape.

In an embodiment, the plurality of trenches of the gate electrode 402 may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have U-shaped trenches spaced at a constant pitch and having a constant width. The pattern may be fabricated by a pitch halving or pitch quartering, or other pitch division, approach.

In another aspect, U-shaped vertical thin film transistors are described. To provide context, vertical transistor structures can provide a compact architecture with cell layout area of 4F2 (e.g., for eDRAM applications), whereas a planar structure is limited to 6F2. In an embodiment, a "U-shaped vertical TFT" is fabricated to provide a footprint with the potential for scaling down to 4F2 for memory applications. In one embodiment, vertical architectures described herein provide for self-aligned isolation of an active area which prevents shorting between neighboring transistors. Such an asymmetric structure can allow for independent tuning of overlap capacitance.

Figure 5A:
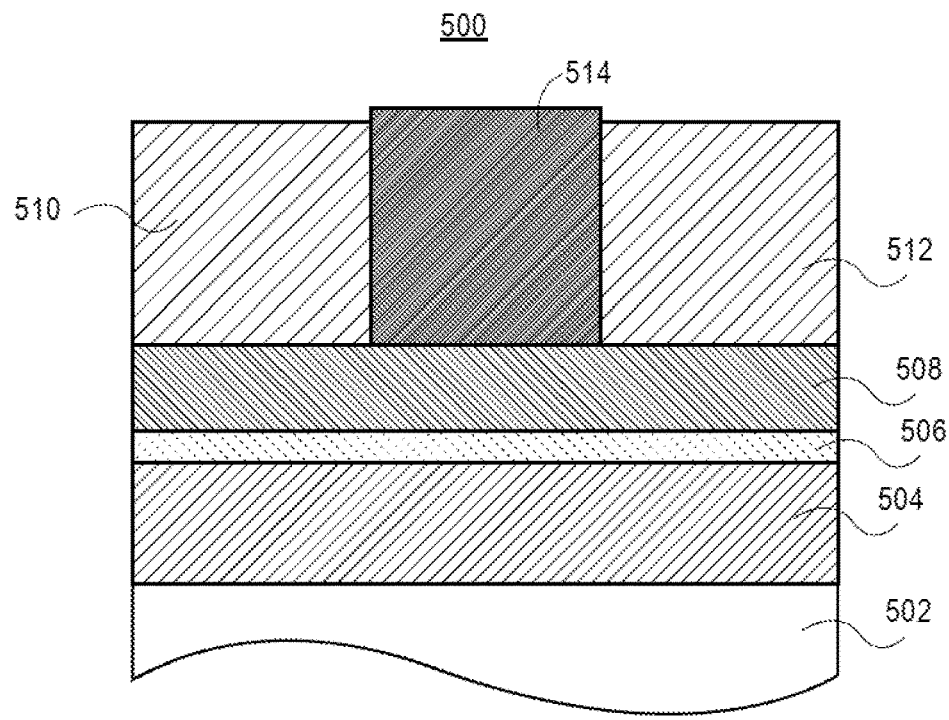
FIGS. 5A and 5B illustrate cross-sectional views of thin film integrated circuit structures without and with a U-shaped feature, in accordance with another embodiment of the present disclosure.
Figure 5B:
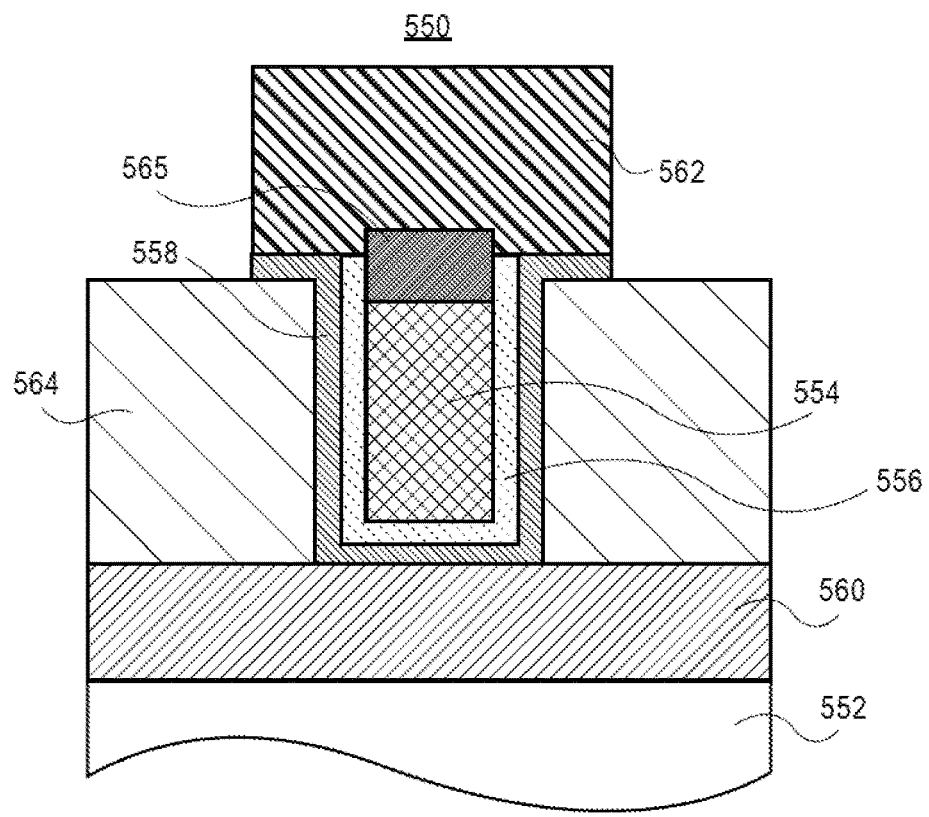

To provide an illustrative comparison for concepts described herein, FIGS. 5A and 5B illustrate cross-sectional views of thin film integrated circuit structures without and with a U-shaped feature, in accordance with another embodiment of the present disclosure.

Referring to FIG. 5A, an integrated circuit structure 500 includes a gate electrode 504 above a substrate 502. A channel material layer 508 is over the gate electrode 504. A first source or drain contact 510 is coupled to the channel material layer 508 at a first end of the channel material layer 508. A second source or drain contact 512 is coupled to the channel material layer 508 at a second end of the channel material layer 508. A dielectric layer 514 is on the channel material layer 508 between the first source or drain contact 510 and the second source or drain contact 512. A gate dielectric layer 506 is between the gate electrode 504 and the channel material layer 508.

By contrast to FIG. 5A, referring to FIG. 5B, an integrated circuit structure 550 includes a first source or drain contact 560 above a substrate 552. An insulator structure 564 is on the first source or drain contact 560. The insulator structure 564 has a trench therein, which is referred to herein as a U-shaped feature. The trench exposes a portion of the first source or drain contact 560. A channel material layer 558 is over the insulator structure 564 and in the trench. The channel material layer 558 is on the portion of the first source or drain contact 560 exposed by the trench. The channel material layer 558 is conformal with the trench. A gate electrode 554 is surrounded by the channel material layer 558 within the trench. A second source or drain contact 562 is over the gate electrode 554 and coupled to the channel material layer 558 at first and second ends of the channel material layer 558 outside of the trench.

In an embodiment, the integrated circuit structure 550 further includes a dielectric layer 565 between the gate electrode 554 and the second source or drain contact 562, as is depicted in FIG. 5B. In an embodiment, the integrated circuit structure 550 further includes a gate dielectric layer 556 between the gate electrode 554 and the channel material layer 558. At least a portion of the gate dielectric layer 556 is in the trench, as is depicted in FIG. 5B.

As an exemplary processing scheme, FIGS. 6A-6H illustrate cross-sectional views of various operations in a method of fabricating a thin film integrated circuit structure of the type of FIG. 5B, in accordance with an embodiment of the present disclosure.

Figure 6A:
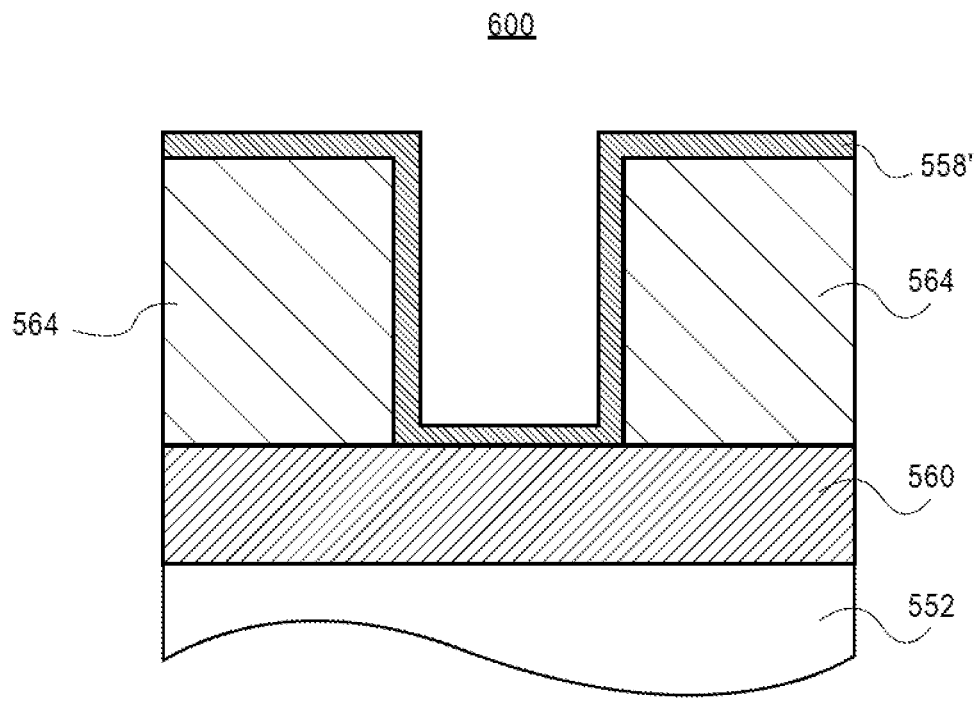
FIGS. 6A-6H illustrate cross-sectional views of various operations in a method of fabricating a thin film integrated circuit structure of the type of FIG. 5B, in accordance with an embodiment of the present disclosure.

Referring to FIG. 6A, a method of fabricating an integrated circuit structure includes forming a first source or drain contact 560 above a substrate 552. An insulator structure 564 is formed on the first source or drain contact 560. The insulator structure 564 has a trench patterned therein, which is referred to herein as a U-shaped feature. The trench exposes a portion of the first source or drain contact 560. A channel material 558' is formed over the insulator structure 564 and in the trench. The channel material 558' is on the portion of the first source or drain contact 560 exposed by the trench. The channel material 558' is conformal with the trench.

Figure 6B:
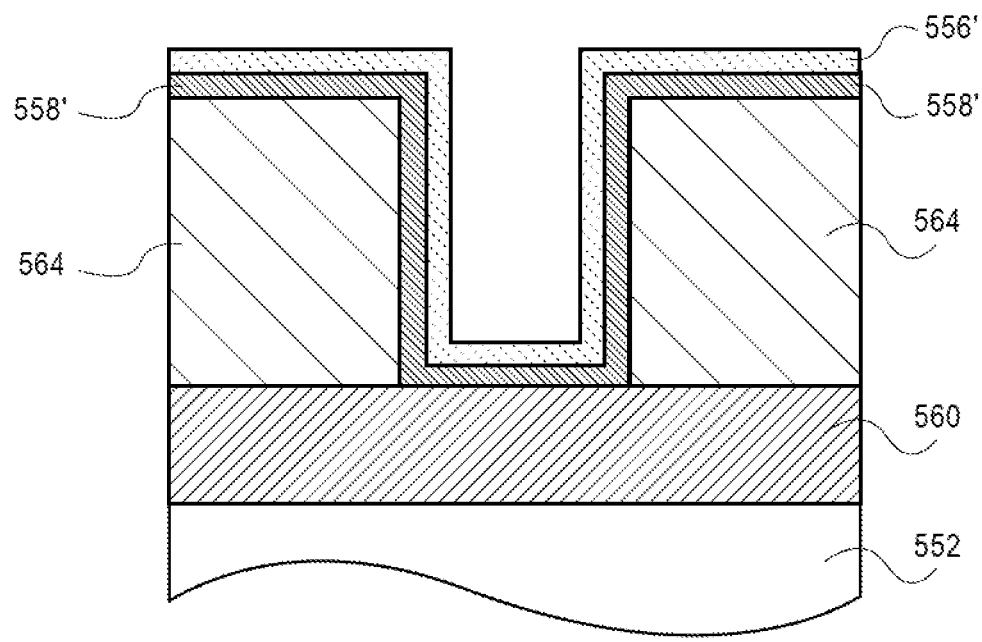

Referring to FIG. 6B, a gate dielectric material 556' is formed on the channel material 558'. At least a portion of the gate dielectric material 556' is formed in the trench of the insulator structure 564.

Figure 6C:
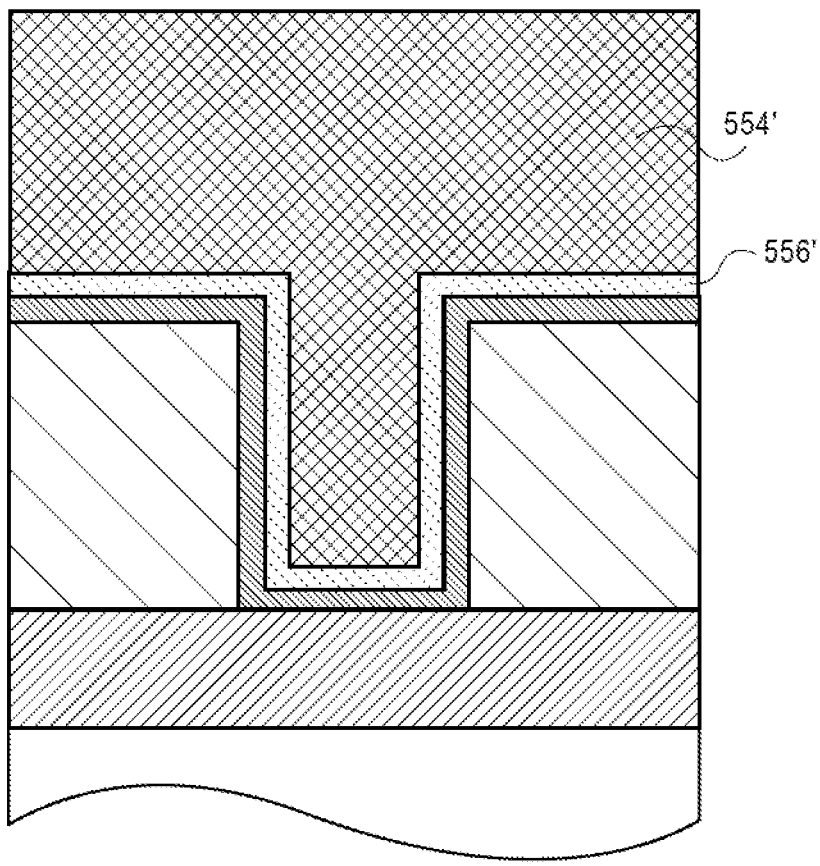

Referring to FIG. 6C, a gate electrode material 554' is formed on the gate dielectric material 556'. At least a portion of the gate electrode material 554' is formed in the trench of the insulator structure 564.

Figure 6D:
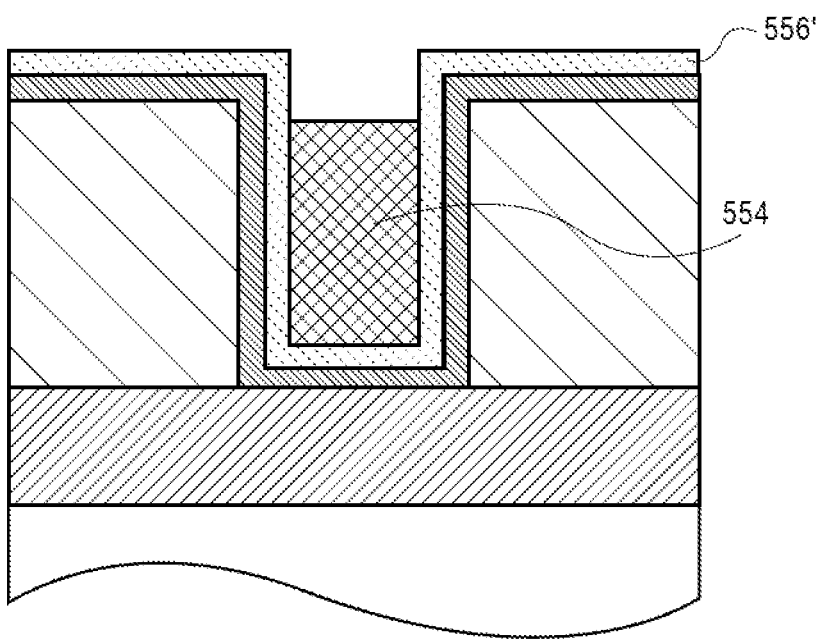

Referring to FIG. 6D, the gate electrode material 554' is recessed within the trench of the insulator structure 564 to form a gate electrode 554.

Figure 6E:
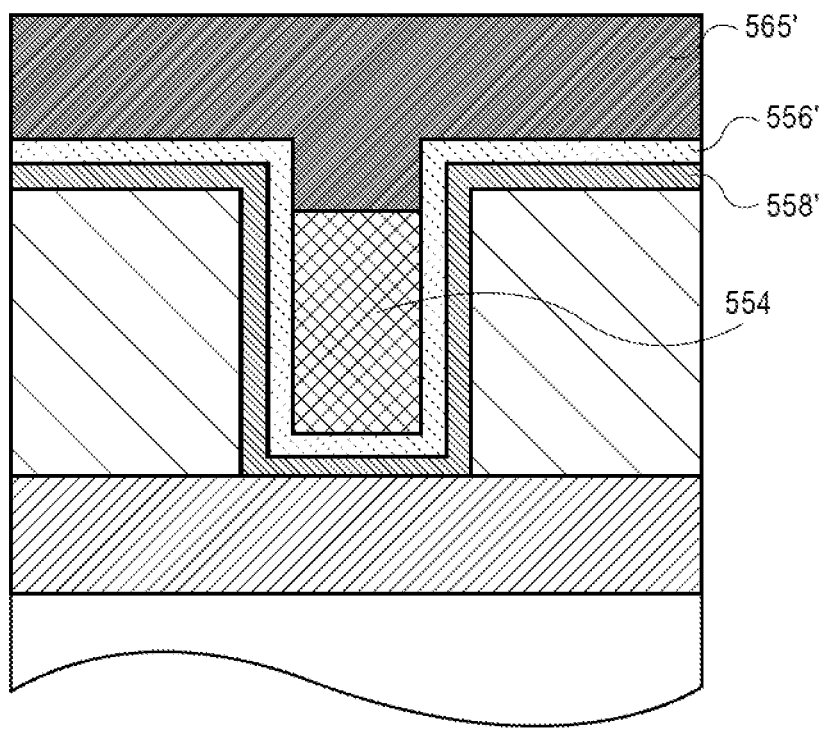

Referring to FIG. 6E, a dielectric material 565' is formed over the structure of FIG. 6D. At least a portion of the dielectric material 565' is formed in the trench of the insulator structure 564.

Figure 6F:
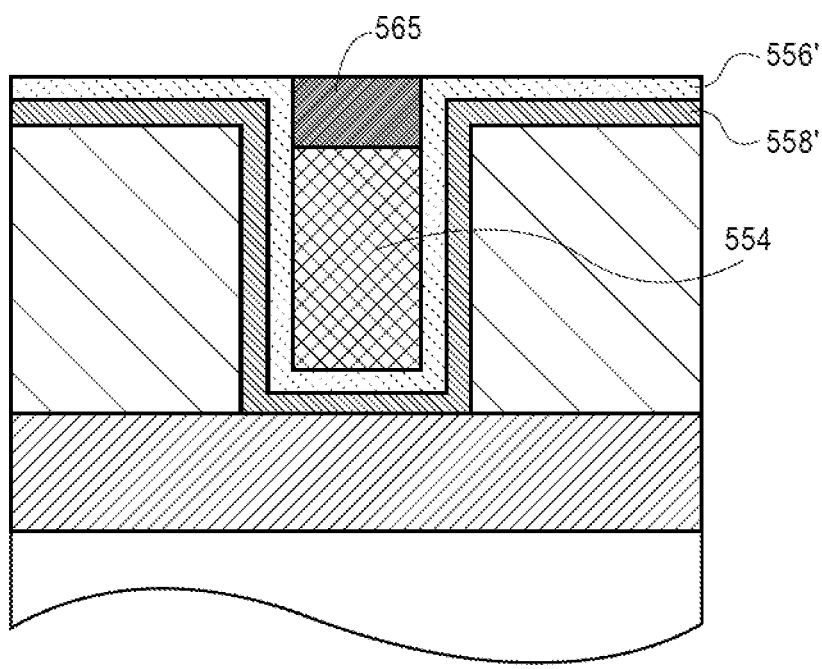

Referring to FIG. 6F, the dielectric material 565' is planarized to form a dielectric layer 565.

Figure 6G:
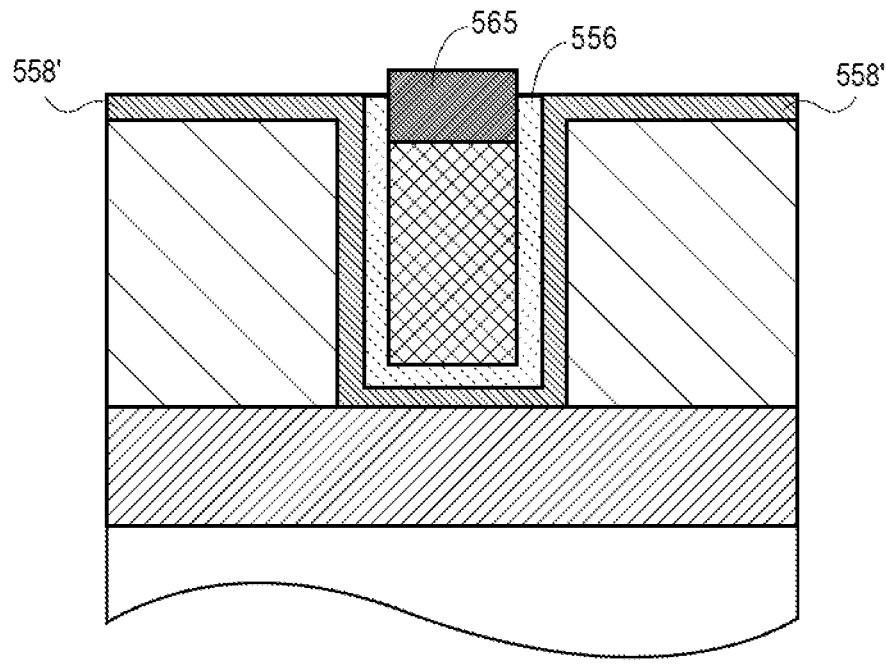

Referring to FIG. 6G, the gate dielectric material 556' is etched to form a gate dielectric layer 556.

Figure 6H:
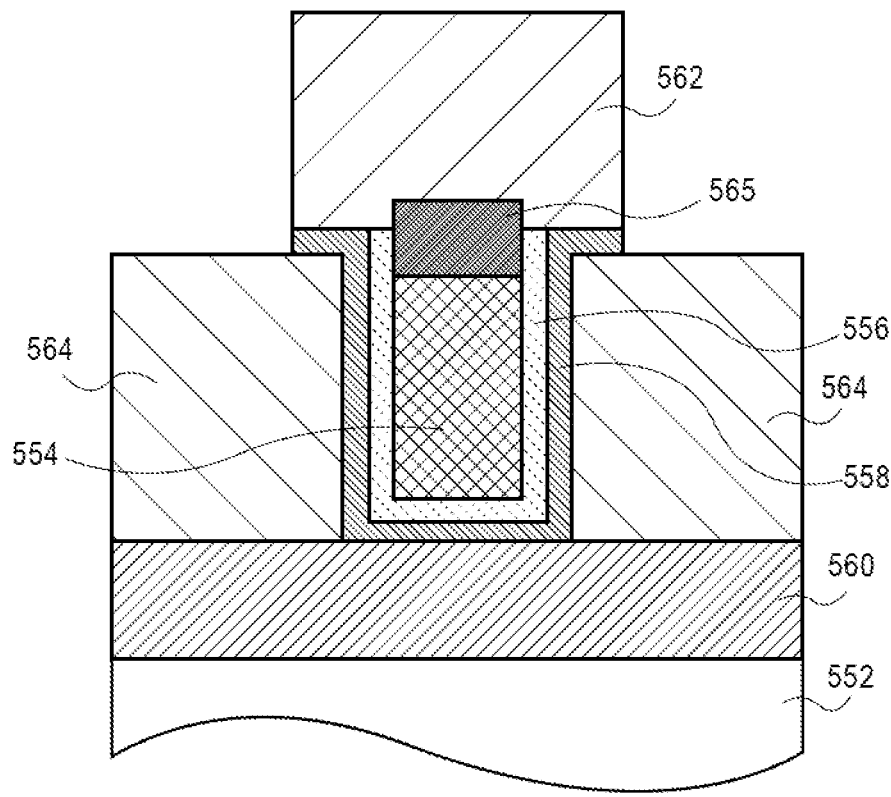

Referring to FIG. 6H, a source or drain contact material is formed over the structure of FIG. 6G. The source or drain contact material is then patterned to form a second source or drain contact 562. In an embodiment, patterning of the source or drain contact material to form the second source or drain contact 562 further includes patterning the channel material 558' to form channel material layer 558. In one such embodiment, the second source or drain contact 562 is in contact with the channel material layer 558 at first and second ends of the channel material layer 558 outside of the trench of the insulator structure 564, as is depicted in FIG. 6H.

It is to be appreciated that the layers and materials described in association with embodiments herein are typically formed on or above an underlying semiconductor substrate 152, 202, 352, 401 or 552, e.g., as FEOL layer(s). In other embodiments, the layers and materials described in association with embodiments herein are typically formed on or above underlying device layer(s) of an integrated circuit, e.g., as BEOL layer(s) above an underlying semiconductor substrate 152, 202, 352, 401 or 552. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers.

In the case that an insulator layer, such as insulator layer 154, is optionally used, the insulator layer may be composed of a material suitable to ultimately electrically isolate, or contribute to the isolation of, portions of a gate structure from an underlying bulk substrate or interconnect layer. For example, in one embodiment, such an insulator layer is composed of a dielectric material such as, but not limited to, silicon dioxide, silicon oxy-nitride, silicon nitride, or carbon-doped silicon nitride. In a particular embodiment, such an insulator layer is a low-k dielectric layer of an underlying BEOL layer.

In an embodiment, the channel material layer 156, 206, 358, 406 or 558 of a TFT includes an IGZO layer that has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO. In another embodiment, the channel material layer 156, 206, 358, 406 or 558 is or includes a material such as tin oxide, antimony oxide, indium oxide, indium tin oxide, titanium oxide, zinc oxide, indium zinc oxide, gallium oxide, titanium oxynitride, ruthenium oxide, or tungsten oxide. In another embodiment, polycrystalline silicon is used as the channel material instead of a semiconducting oxide material. In an embodiment, no matter the composition, the channel material layer 156, 206, 358, 406 or 558 has a thickness between 5 nanometers and 30 nanometers. In another embodiment, the channel material layer 156, 206, 358, 406 or 558 of a TFT includes an oxide semiconductor such as, but not limited to, $SnO$, $SnO_2$, $Cu_2O$, $CoO$, $ZnO$, $Ga_2O_3$, IZO, ITO, AZO, or $TiO_2$. In another embodiment, the channel material layer 156, 206, 358, 406 or 558 includes a material such as, but not limited to, poly-Si, poly-SiGe, poly-Ge, poly-III-V, BeTe, or other tellurides.

In an embodiment, the channel material layer 156, 206, 358, 406 or 558 is an amorphous, crystalline, or semi crystalline oxide semiconductor, such as an amorphous, crystalline, or semi crystalline oxide semiconducting IGZO layer. The semiconducting oxide material may be formed using a low-temperature deposition process, such as physical vapor deposition (PVD) (e.g., sputtering), atomic layer deposition (ALD), or chemical vapor deposition (CVD). The ability to deposit the semiconducting oxide material at temperatures low enough to be compatible with back-end manufacturing processes represents a particular advantage. The semiconducting oxide material may be deposited on sidewalls or conformably on any desired structure to a precise thickness, allowing the manufacture of transistors having any desired geometry.

In an embodiment, gate electrodes described herein include at least one P-type work function metal or N-type work function metal, depending on whether the integrated circuit device 150, 200, 350, 400 or 550 is to be included in a P-type transistor or an N-type transistor. For a P-type transistors, metals that may be used for the gate electrode may include, but are not limited to, ruthenium, palladium, platinum, cobalt, nickel, and conductive metal oxides (e.g., ruthenium oxide). For an N-type transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode includes a stack of two or more metal layers, where one or more metal layers are work function metal layers and at least one metal layer is a fill metal layer. Further metal layers may be included for other purposes, such as to act as a barrier layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, gate dielectric layers described herein are composed of or include a high-K material. For example, in one embodiment, a gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In some implementations, the gate dielectric may consist of a "U"-shaped structure that includes a bottom portion substantially parallel to the surface of the substrate and two sidewall portions that are substantially perpendicular to the top surface of the substrate.

In some embodiments, the channel material 156, 206, 358, 406 or 558 is in contact with a gate dielectric layer 164, 208, 356, 404 or 556, respectively, an arrangement which may put an IGZO layer in contact with a high-k metal oxide layer. In other embodiments, an intermediate material is disposed between the channel material 156, 206, 358, 406 or 558 and the gate dielectric layer 164, 208, 356, 404 or 556, respectively. In some embodiments, an IGZO layer includes multiple regions of IGZO having different material properties. For example, an IGZO layer may include low indium content IGZO close to (e.g., in contact with) a high-k gate dielectric layer, and a high indium content IGZO close to (e.g., in contact with) the higher mobility semiconducting oxide channel material. High indium content IGZO may provide higher mobility and poorer interface properties relative to low indium content IGZO, while low indium content IGZO may provide a wider band gap, lower gate leakage, and better interface properties, although a lower mobility, relative to high indium content IGZO.

In an embodiment, dielectric spacers are formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used. For example, two pairs, three pairs, or four pairs of sidewall spacers may be formed on opposing sides of the gate electrode.

In an embodiment, conductive contacts act as contacts to source or drain regions of a TFT, or act directly as source or drain regions of the TFT. The conductive contacts may be spaced apart by a distance that is the gate length of the transistor integrated circuit device 150, 200, 350, 400 or 550. In some embodiments, the gate length is between 7 and 30 nanometers. In an embodiment, the conductive contacts include one or more layers of metal and/or metal alloys. In a particular embodiment, the conductive contacts are composed of aluminum or an aluminum-containing alloy.

In an embodiment, interconnect lines (and, possibly, underlying via structures), such as interconnect lines, described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein are composed of or include a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In one aspect, a gate electrode and gate dielectric layer may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structures described herein. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed. The anneal is performed prior to formation of the permanent contacts.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an antireflective coating (ARC) layer, and a photoresist layer. In a particular such embodiment, the topographic masking portion is a carbon hardmask (CHM) layer and the antireflective coating layer is a silicon ARC layer.

In another aspect, the performance of a thin film transistor (TFT) may depend on the carrier mobility of the components in the TFT. For example, a material with a higher carrier mobility enables carriers to move more quickly in response to a given electric field than a material with a lower carrier mobility. Accordingly, high carrier mobilities may be associated with improved performance. Although shown and described above as single semiconducting oxide layers, in accordance with embodiments described herein, a layer of a semiconducting oxide, such as a layer of IGZO, is between a high-k gate dielectric material and a higher mobility semiconducting oxide channel material. Although IGZO has a relatively low mobility (approximately 10 $cm^2/V$-s), the sub threshold swing of IGZO may be close to the conventional theoretical lower limit. In some embodiments, a thin layer of IGZO may directly border a channel material of choice, and may be sandwiched between the channel material and the high-k dielectric. The use of IGZO at the interface between the gate stack and the channel may achieve one or more of a number of advantages. For example, an IGZO interface may have a relatively small number of interface traps, defects at which carriers are trapped and released that impede performance. A TFT that includes an IGZO layer as a second semiconducting oxide material may exhibit desirably low gate leakage. When IGZO is used as an interface to a non-IGZO semiconducting oxide channel material (e.g., a thin film oxide semiconductor material having a higher mobility than IGZO), the benefits of the higher mobility channel material may be realized simultaneously with the good gate oxide interface properties provided by the IGZO. In accordance with one or more embodiments described herein, a gate-channel arrangement based on a dual semiconducting oxide layer channel enables the use of a wider array of thin film transistor channel materials, while achieving desirable gate control, than realizable using conventional approaches.

In an embodiment, the addition of a second thin film semiconductor around a first TFT material can provide one or more of mobility enhancement, improved short channel effects (SCEs) particularly if all conduction occurs in the second material. The second TFT material may be selected for strong oxygen bond capability in order to stabilize the TFT when exposed to downstream processing. In accordance with one embodiment, a higher mobility semiconducting oxide material is effectively wrapped in a lower mobility material semiconducting oxide that is more oxygen stable. The resulting structure may limit the negative effects of downstream high temperature processing operations or aggressive operations on the inner TFT material by having the highly stable outer material. An increased set of materials that can be chosen to maximize stability and mobility simultaneously may be achieved using such a dual material architecture.

In another aspect, the integrated circuit structures described herein may be included in an electronic device. As a first example of an apparatus that may include one or more of the TFTs disclosed herein, FIGS. 7A and 7B are top views of a wafer and dies that include one or more thin film transistors having U-shaped features, in accordance with any of the embodiments disclosed herein.

Figure 7B:
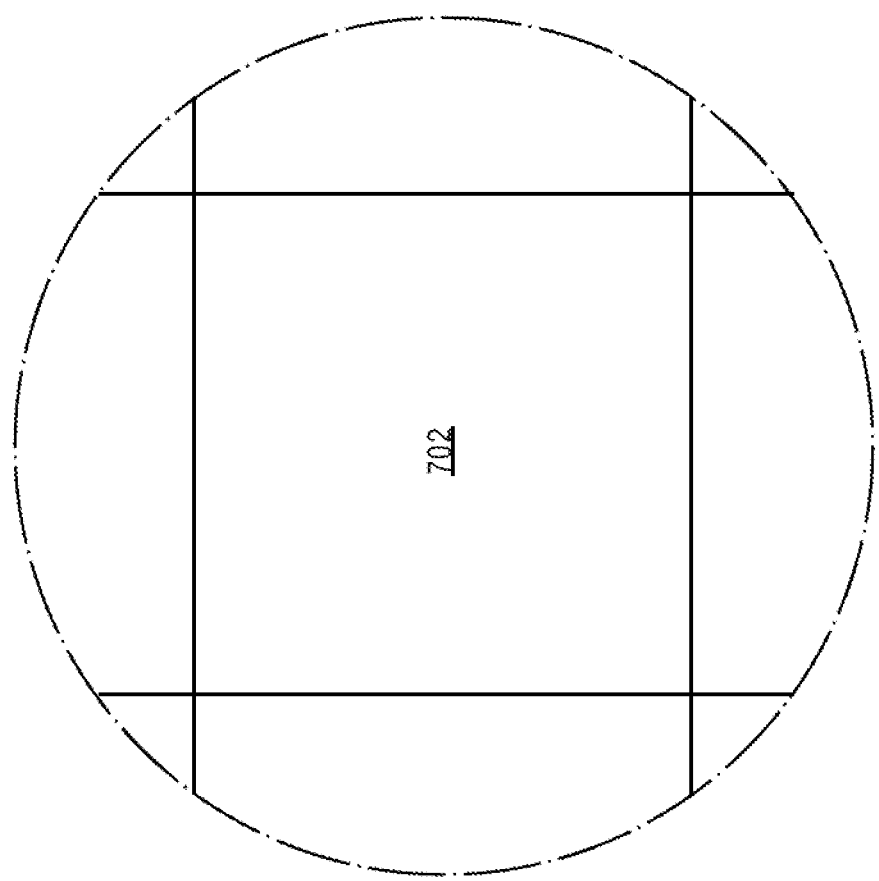
FIGS. 7A and 7B are top views of a wafer and dies that include one or more thin film transistors having U-shaped features, in accordance with one or more of the embodiments disclosed herein.
Figure 7A:
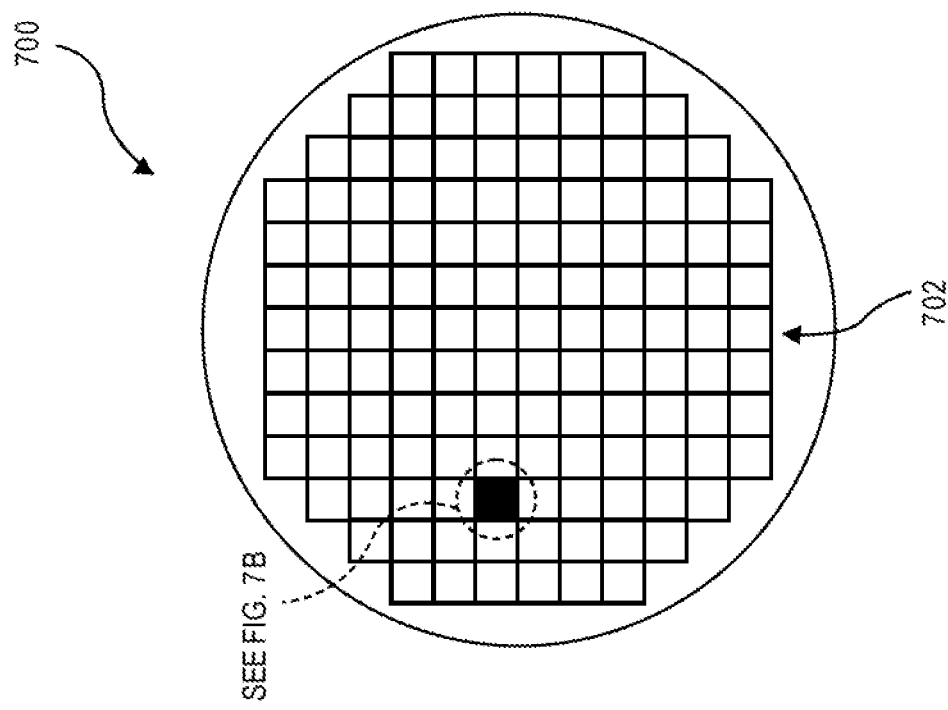

Referring to FIGS. 7A and 7B, a wafer 700 may be composed of semiconductor material and may include one or more dies 702 having integrated circuit (IC) structures formed on a surface of the wafer 700. Each of the dies 702 may be a repeating unit of a semiconductor product that includes any suitable IC (e.g., ICs including one or more structures such as structures 200, 350, 400 or 550). After the fabrication of the semiconductor product is complete (e.g., after manufacture of structures 200, 350, 400 or 550), the wafer 700 may undergo a singulation process in which each of the dies 702 is separated from one another to provide discrete "chips" of the semiconductor product. In particular, devices that include TFT as disclosed herein may take the form of the wafer 700 (e.g., not singulated) or the form of the die 702 (e.g., singulated). The die 702 may include one or more transistors and/or supporting circuitry to route electrical signals to the transistors, as well as any other IC components. In some embodiments, the wafer 700 or the die 702 may include a memory device (e.g., a static random access memory (SRAM) device), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processing device or other logic that is configured to store information in the memory devices or execute instructions stored in the memory array.

Figure 8:
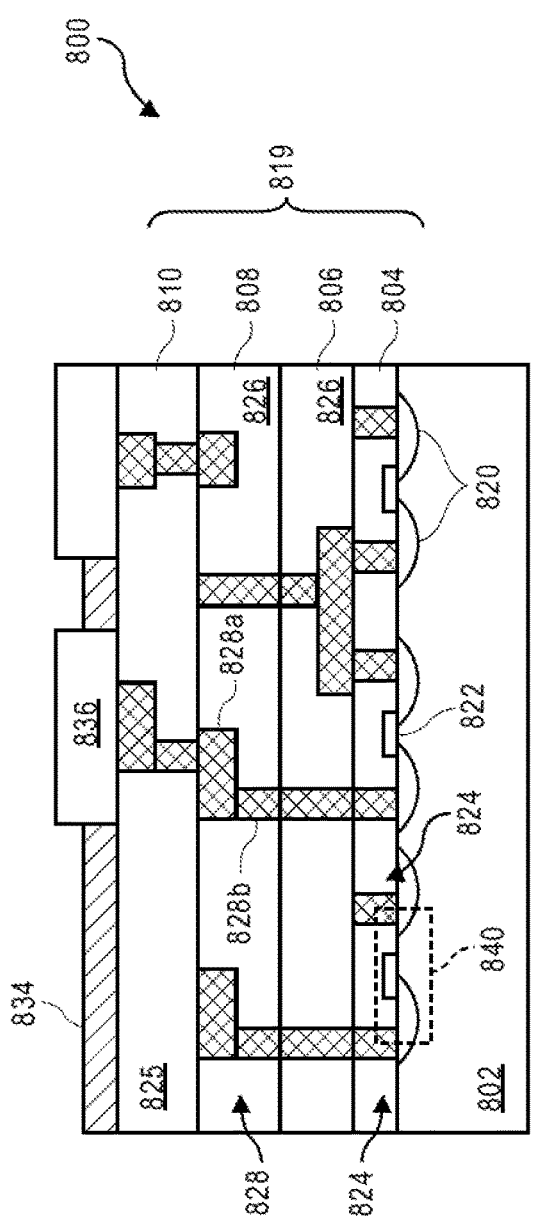
FIG. 8 is a cross-sectional side view of an integrated circuit (IC) device that may include one or more thin film transistors having U-shaped features, in accordance with one or more of the embodiments disclosed herein.

FIG. 8 is a cross-sectional side view of an integrated circuit (IC) device that may include one or more thin film transistors having U-shaped features, in accordance with one or more of the embodiments disclosed herein.

Referring to FIG. 8, an IC device 800 is formed on a substrate 802 (e.g., the wafer 700 of FIG. 7A) and may be included in a die (e.g., the die 702 of FIG. 7B), which may be singulated or included in a wafer. Although a few examples of materials from which the substrate 802 may be formed are described above in association with substrate 202, 352, 401 or 552, any material that may serve as a foundation for an IC device 800 may be used.

The IC device 800 may include one or more device layers, such as device layer 804, disposed on the substrate 802. The device layer 804 may include features of one or more transistors 840 (e.g., TFTs described above) formed on the substrate 802. The device layer 804 may include, for example, one or more source and/or drain (S/D) regions 820, a gate 822 to control current flow in the transistors 840 between the S/D regions 820, and one or more S/D contacts 824 to route electrical signals to/from the S/D regions 820. The transistors 840 may include additional features not depicted for the sake of clarity, such as device isolation regions, gate contacts, and the like. The transistors 840 are not limited to the type and configuration depicted in FIG. 8 and may include a wide variety of other types and configurations such as, for example, planar transistors, non-planar transistors, or a combination of both. Non-planar transistors may include Fin-based transistors, such as double-gate transistors or tri-gate transistors, and wrap-around or all-around gate transistors, such as nanoribbon and nanowire transistors. In particular, one or more of the transistors 840 take the form of the transistors 200, 350, 400 or 550. Thin-film transistors such as 200, 350, 400 or 550 may be particularly advantageous when used in the metal layers of a microprocessor device for analog circuitry, logic circuitry, or memory circuitry, and may be formed along with existing complementary metal oxide semiconductor (CMOS) processes.

Electrical signals, such as power and/or input/output (I/O) signals, may be routed to and/or from the transistors 840 of the device layer 804 through one or more interconnect layers disposed on the device layer 804 (illustrated in FIG. 8 as interconnect layers 806-810). For example, electrically conductive features of the device layer 804 (e.g., the gate 822 and the S/D contacts 824) may be electrically coupled with the interconnect structures 828 of the interconnect layers 806-810. The one or more interconnect layers 806-810 may form an interlayer dielectric (ILD) stack 819 of the IC device 800.

The interconnect structures 828 may be arranged within the interconnect layers 806-810 to route electrical signals according to a wide variety of designs (in particular, the arrangement is not limited to the particular configuration of interconnect structures 828 depicted in FIG. 8). Although a particular number of interconnect layers 806-810 is depicted in FIG. 8, embodiments of the present disclosure include IC devices having more or fewer interconnect layers than depicted.

In some embodiments, the interconnect structures 828 may include trench structures 828a (sometimes referred to as "lines") and/or via structures 828b filled with an electrically conductive material such as a metal. The trench structures 828a may be arranged to route electrical signals in a direction of a plane that is substantially parallel with a surface of the substrate 802 upon which the device layer 804 is formed. For example, the trench structures 828a may route electrical signals in a direction in and out of the page from the perspective of FIG. 8. The via structures 828b may be arranged to route electrical signals in a direction of a plane that is substantially perpendicular to the surface of the substrate 802 upon which the device layer 804 is formed. In some embodiments, the via structures 828b may electrically couple trench structures 828a of different interconnect layers 806-810 together.

The interconnect layers 806-810 may include a dielectric material 826 disposed between the interconnect structures 828, as shown in FIG. 8. In some embodiments, the dielectric material 826 disposed between the interconnect structures 828 in different ones of the interconnect layers 806-810 may have different compositions; in other embodiments, the composition of the dielectric material 826 between different interconnect layers 806-810 may be the same. In either case, such dielectric materials may be referred to as inter-layer dielectric (ILD) materials.

A first interconnect layer 806 (referred to as Metal 1 or "M1") may be formed directly on the device layer 804. In some embodiments, the first interconnect layer 806 may include trench structures 828a and/or via structures 828b, as shown. The trench structures 828a of the first interconnect layer 806 may be coupled with contacts (e.g., the S/D contacts 824) of the device layer 804.

A second interconnect layer 808 (referred to as Metal 2 or "M2") may be formed directly on the first interconnect layer 806. In some embodiments, the second interconnect layer 808 may include via structures 828b to couple the trench structures 828a of the second interconnect layer 808 with the trench structures 828a of the first interconnect layer 806. Although the trench structures 828a and the via structures 828b are structurally delineated with a line within each interconnect layer (e.g., within the second interconnect layer 808) for the sake of clarity, the trench structures 828a and the via structures 828b may be structurally and/or materially contiguous (e.g., simultaneously filled during a dual-damascene process) in some embodiments.

A third interconnect layer 810 (referred to as Metal 3 or "M3") (and additional interconnect layers, as desired) may be formed in succession on the second interconnect layer 808 according to similar techniques and configurations described in connection with the second interconnect layer 808 or the first interconnect layer 806.

The IC device 800 may include a solder resist material 834 (e.g., polyimide or similar material) and one or more bond pads 836 formed on the interconnect layers 806-810. The bond pads 836 may be electrically coupled with the interconnect structures 828 and configured to route the electrical signals of the transistor(s) 840 to other external devices. For example, solder bonds may be formed on the one or more bond pads 836 to mechanically and/or electrically couple a chip including the IC device 800 with another component (e.g., a circuit board). The IC device 800 may have other alternative configurations to route the electrical signals from the interconnect layers 806-810 than depicted in other embodiments. For example, the bond pads 836 may be replaced by or may further include other analogous features (e.g., posts) that route the electrical signals to external components.

Figure 9:
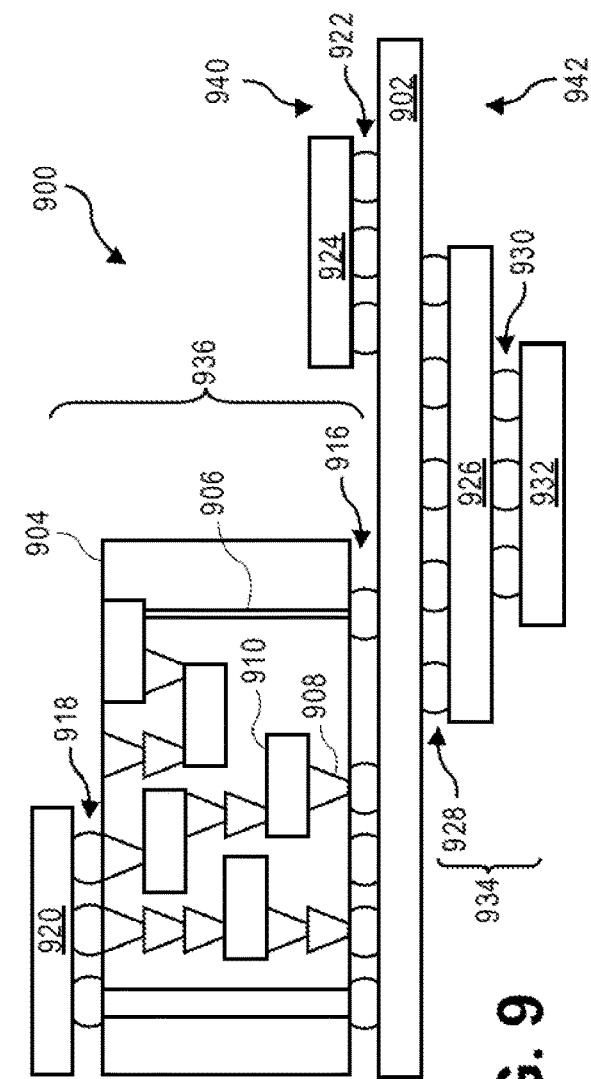
FIG. 9 is a cross-sectional side view of an integrated circuit (IC) device assembly that may include one or more thin film transistors having U-shaped features, in accordance with one or more of the embodiments disclosed herein.

FIG. 9 is a cross-sectional side view of an integrated circuit (IC) device assembly that may include one or more thin film transistors having U-shaped features, in accordance with one or more of the embodiments disclosed herein.

Referring to FIG. 9, an IC device assembly 900 includes components having one or more integrated circuit structures described herein. The IC device assembly 900 includes a number of components disposed on a circuit board 902 (which may be, e.g., a motherboard). The IC device assembly 900 includes components disposed on a first face 940 of the circuit board 902 and an opposing second face 942 of the circuit board 902. Generally, components may be disposed on one or both faces 940 and 942. In particular, any suitable ones of the components of the IC device assembly 900 may include a number of the TFT structures 200, 350, 400 or 550 disclosed herein.

In some embodiments, the circuit board 902 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate.

The IC device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), male and female portions of a socket, an adhesive, an underfill material, and/or any other suitable electrical and/or mechanical coupling structure.

The package-on-interposer structure 936 may include an IC package 920 coupled to an interposer 904 by coupling components 918. The coupling components 918 may take any suitable form for the application, such as the forms discussed above with reference to the coupling components 916. Although a single IC package 920 is shown in FIG. 9, multiple IC packages may be coupled to the interposer 904. It is to be appreciated that additional interposers may be coupled to the interposer 904. The interposer 904 may provide an intervening substrate used to bridge the circuit board 902 and the IC package 920. The IC package 920 may be or include, for example, a die (the die 702 of FIG. 7B), an IC device (e.g., the IC device 800 of FIG. 8), or any other suitable component. Generally, the interposer 904 may spread a connection to a wider pitch or reroute a connection to a different connection. For example, the interposer 904 may couple the IC package 920 (e.g., a die) to a ball grid array (BGA) of the coupling components 916 for coupling to the circuit board 902. In the embodiment illustrated in FIG. 9, the IC package 920 and the circuit board 902 are attached to opposing sides of the interposer 904. In other embodiments, the IC package 920 and the circuit board 902 may be attached to a same side of the interposer 904. In some embodiments, three or more components may be interconnected by way of the interposer 904.

The interposer 904 may be formed of an epoxy resin, a fiberglass-reinforced epoxy resin, a ceramic material, or a polymer material such as polyimide. In some implementations, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias 910, including but not limited to through-silicon vias (TSVs) 906. The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art.

The IC device assembly 900 may include an IC package 924 coupled to the first face 940 of the circuit board 902 by coupling components 922. The coupling components 922 may take the form of any of the embodiments discussed above with reference to the coupling components 916, and the IC package 924 may take the form of any of the embodiments discussed above with reference to the IC package 920.

The IC device assembly 900 illustrated in FIG. 9 includes a package-on-package structure 934 coupled to the second face 942 of the circuit board 902 by coupling components 928. The package-on-package structure 934 may include an IC package 926 and an IC package 932 coupled together by coupling components 930 such that the IC package 926 is disposed between the circuit board 902 and the IC package 932. The coupling components 928 and 930 may take the form of any of the embodiments of the coupling components 916 discussed above, and the IC packages 926 and 932 may take the form of any of the embodiments of the IC package 920 discussed above. The package-on-package structure 934 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
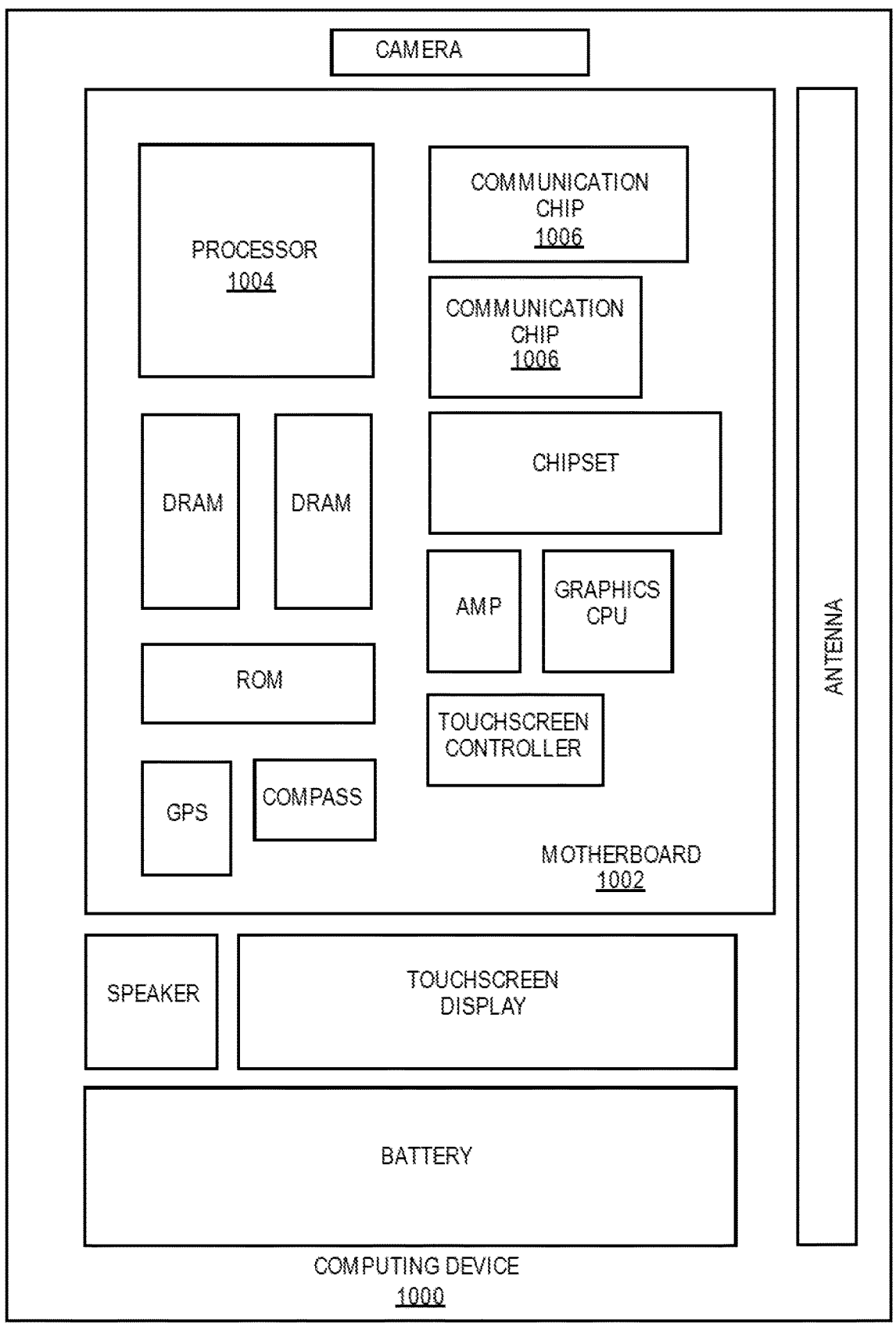
FIG. 10 illustrates a computing device in accordance with one implementation of an embodiment of the disclosure.

FIG. 10 illustrates a computing device 1000 in accordance with one implementation of the disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the disclosure, the integrated circuit die of the processor includes one or more thin film transistors having U-shaped features, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of embodiments of the disclosure, the integrated circuit die of the communication chip includes one or more thin film transistors having U-shaped features, in accordance with implementations of embodiments of the disclosure.

In further implementations, another component housed within the computing device 1000 may contain an integrated circuit die that includes one or more thin film transistors having U-shaped features, in accordance with implementations of embodiments of the disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Thus, embodiments described herein include thin film transistors having U-shaped features.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes an insulator structure above a substrate, the insulator structure having a plurality of trenches therein, and the insulator structure having a first side opposite a second side. A channel material layer is on the insulator structure, the channel material layer conformal with the plurality of trenches. A gate electrode is over the channel material layer and in the plurality of trenches. A first source or drain region is coupled to the channel material layer at the first side of the insulator structure. A second source or drain region is coupled to the channel material layer at the second side of the insulator structure.

Example embodiment 2: The integrated circuit structure of example embodiment 1, wherein the first and second source or drain regions are continuous with the channel material layer.

Example embodiment 3: The integrated circuit structure of example embodiment 1 or 2, wherein channel material layer includes a semiconducting oxide material.

Example embodiment 4: The integrated circuit structure of example embodiment 1 or 2, wherein channel material layer includes polycrystalline silicon.

Example embodiment 5: The integrated circuit structure of example embodiment 1, 2, 3 or 4, further including a gate dielectric layer between the gate electrode and the channel material layer and in the plurality of trenches.

Example embodiment 6: An integrated circuit structure including a gate electrode above a substrate, the gate electrode having a trench therein. A channel material layer is over the gate electrode and in the trench, the channel material layer conformal with the trench. A first source or drain contact is coupled to the channel material layer at a first end of the channel material layer outside of the trench. A second source or drain contact is coupled to the channel material layer at a second end of the channel material layer outside of the trench.

Example embodiment 7: The integrated circuit structure of example embodiment 6, further including a dielectric layer on the channel material layer and in the trench.

Example embodiment 8: The integrated circuit structure of example embodiment 6 or 7, wherein channel material layer includes a semiconducting oxide material.

Example embodiment 9: The integrated circuit structure of example embodiment 6 or 7, wherein channel material layer includes polycrystalline silicon.

Example embodiment 10: The integrated circuit structure of example embodiment 6, 7, 8 or 9, further including a gate dielectric layer between the gate electrode and the channel material layer and in the trench.

Example embodiment 11: An integrated circuit structure includes a gate electrode above a substrate, the gate electrode having a plurality of trenches therein, and the gate electrode having a first side opposite a second side. A channel material layer is over the gate electrode, the channel material layer conformal with the plurality of trenches. An insulator structure is on the channel material layer and in the plurality of trenches. A first source or drain region is coupled to the channel material layer at the first side of the gate electrode. A second source or drain region is coupled to the channel material layer at the second side of the gate electrode.

Example embodiment 12: The integrated circuit structure of example embodiment 11, wherein the first and second source or drain regions are continuous with the channel material layer.

Example embodiment 13: The integrated circuit structure of example embodiment 11 or 12, wherein channel material layer includes a semiconducting oxide material.

Example embodiment 14: The integrated circuit structure of example embodiment 11 or 12, wherein channel material layer includes polycrystalline silicon.

Example embodiment 15: The integrated circuit structure of example embodiment 11, 12, 13 or 14, further including a gate dielectric layer between the gate electrode and the channel material layer and in the plurality of trenches.

Example embodiment 16: An integrated circuit structure includes a first source or drain contact above a substrate. An insulator structure is on the first source or drain contact, the insulator structure having a trench therein, the trench exposing a portion of the first source or drain contact. A channel material layer is over the insulator structure and in the trench on the portion of the first source or drain contact, the channel material layer conformal with the trench. A gate electrode is surrounded by the channel material layer within the trench. A second source or drain contact is over the gate electrode and coupled to the channel material layer at first and second ends of the channel material layer outside of the trench.

Example embodiment 17: The integrated circuit structure of example embodiment 16, further including a dielectric layer between the gate electrode and the second source or drain contact.

Example embodiment 18: The integrated circuit structure of example embodiment 16 or 17, wherein channel material layer includes a semiconducting oxide material.

Example embodiment 19: The integrated circuit structure of example embodiment 16 or 17, wherein channel material layer includes polycrystalline silicon.

Example embodiment 20: The integrated circuit structure of example embodiment 16, 17, 18 or 19, further including a gate dielectric layer between the gate electrode and the channel material layer and in the trench.

What is claimed is:

1. An integrated circuit structure, comprising:
    an insulator structure above a substrate, the insulator structure having a U-shaped feature, the U-shaped feature having a first side, a bottom, and a second side;
    a channel material layer on the first side, on the bottom, and on the second side of the U-shaped feature of the insulator structure;
    a gate electrode over the channel material layer and at least partially within the U-shaped feature;
    a first source or drain region coupled to the channel material layer at a first side of the insulator structure; and
    a second source or drain region coupled to the channel material layer at a second side of the insulator structure, wherein the U-shaped feature of the insulator structure is between the first source or drain region and the second source or drain region.

2. The integrated circuit structure of claim 1, wherein the first and second source or drain regions are continuous with the channel material layer.

3. The integrated circuit structure of claim 1, wherein channel material layer comprises a semiconducting oxide material.

4. The integrated circuit structure of claim 1, wherein channel material layer comprises polycrystalline silicon.

5. The integrated circuit structure of claim 1, further comprising:
    a gate dielectric layer between the gate electrode and the channel material layer, the gate dielectric layer at least partially within the U-shaped feature.

6. An integrated circuit structure, comprising:
    a gate electrode above a substrate, the gate electrode having a U-shaped feature, the U-shaped feature having a first side, a bottom, and a second side;
    a channel material layer along the first side, along the bottom, and along the second side of the U-shaped feature of the gate electrode;
    an insulator structure on the channel material layer and at least partially within the U-shaped feature;
    a first source or drain region coupled to the channel material layer at a first side of the gate electrode; and
    a second source or drain region coupled to the channel material layer at a second side of the gate electrode.

7. The integrated circuit structure of claim 6, wherein the first and second source or drain regions are continuous with the channel material layer.

8. The integrated circuit structure of claim 6, wherein channel material layer comprises a semiconducting oxide material.

9. The integrated circuit structure of claim 6, wherein channel material layer comprises polycrystalline silicon.

10. The integrated circuit structure of claim 6, further comprising:
    a gate dielectric layer between the gate electrode and the channel material layer, the gate dielectric layer at least partially within the U-shaped feature.

11. A computing device, comprising:
    a board; and
    a component coupled to the board, the component including an integrated circuit structure, comprising:
        an insulator structure above a substrate, the insulator structure having a U-shaped feature, the U-shaped feature having a first side, a bottom, and a second side;
        a channel material layer on the first side, on the bottom, and on the second side of the U-shaped feature of the insulator structure;
        a gate electrode over the channel material layer and at least partially within the U-shaped feature;
        a first source or drain region coupled to the channel material layer at a first side of the insulator structure; and
        a second source or drain region coupled to the channel material layer at a second side of the insulator structure, wherein the U-shaped feature of the insulator structure is between the first source or drain region and the second source or drain region.

12. The computing device of claim 11, further comprising:
a memory coupled to the board.

13. The computing device of claim 11, further comprising:
a communication chip coupled to the board.

14. The computing device of claim 11, wherein the component is a packaged integrated circuit die.

15. The computing device of claim 11, wherein the component is selected from the group consisting of a processor, a communications chip, and a digital signal processor.

16. A computing device, comprising:
a board; and
a component coupled to the board, the component including an integrated circuit structure, comprising:
a gate electrode above a substrate, the gate electrode having a U-shaped feature, the U-shaped feature having a first side, a bottom, and a second side;
a channel material layer along the first side, along the bottom, and along the second side of the U-shaped feature of the gate electrode;
an insulator structure on the channel material layer and at least partially within the U-shaped feature;
a first source or drain region coupled to the channel material layer at a first side of the gate electrode; and
a second source or drain region coupled to the channel material layer at a second side of the gate electrode.

17. The computing device of claim 16, further comprising:
a memory coupled to the board.

18. The computing device of claim 16, further comprising:
a communication chip coupled to the board.

19. The computing device of claim 16, wherein the component is a packaged integrated circuit die.

20. The computing device of claim 16, wherein the component is selected from the group consisting of a processor, a communications chip, and a digital signal processor.

* * * * *